US012745488B2

(12) United States Patent
Liu et al.

(10) Patent No.: US 12,745,488 B2
(45) Date of Patent: Sep. 22, 2026

(54) EPITAXIAL STRUCTURE OF LIGHT-EMITTING DEVICE AND MANUFACTURING METHOD THEREOF

(71) Applicant: ENKRIS SEMICONDUCTOR, INC., Suzhou (CN)

(72) Inventors: Weihua Liu, Suzhou (CN); Kai Cheng, Suzhou (CN)

(73) Assignee: ENKRIS SEMICONDUCTOR, INC., Suzhou (CN)

(*) Notice: Subject to any disclaimer, the term of this patent is extended or adjusted under 35 U.S.C. 154(b) by 348 days.

(21) Appl. No.: 18/447,399

(22) Filed: Aug. 10, 2023

(65) Prior Publication Data

US 2024/0072204 A1 Feb. 29, 2024

(30) Foreign Application Priority Data

Aug. 23, 2022 (CN) ........................ 202211014415.5

(51) Int. Cl.

*H10H 20/82* (2025.01)
*H10H 20/01* (2025.01)
*H10H 20/812* (2025.01)
*H10H 20/825* (2025.01)

(52) U.S. Cl.

CPC ........ *H10H 20/82* (2025.01); *H10H 20/0137* (2025.01); *H10H 20/812* (2025.01); *H10H 20/825* (2025.01)

(58) Field of Classification Search

CPC ..... H10H 20/82; H10H 20/825; H10H 20/821
See application file for complete search history.

(56) References Cited

U.S. PATENT DOCUMENTS

2005/0056850 A1 3/2005 Taki
2013/0037779 A1* 2/2013 Takeoka ............. H10H 20/8215 438/36
2016/0087146 A1* 3/2016 Yamane ............ H01L 21/02458 257/13

FOREIGN PATENT DOCUMENTS

CN 102842659 A 12/2012
CN 108695417 A 10/2018
CN 110034213 A 7/2019
JP 2009054616 A 3/2009
KR 20160016585 A 2/2016

OTHER PUBLICATIONS

State Intellectual Property Office of the People's Republic of China, Office Action and Search Report Issued in Application No. 2022110144155, Jul. 17, 2026, 14 pages. (Submitted with English Translation).

* cited by examiner

*Primary Examiner* — Douglas M Menz
(74) *Attorney, Agent, or Firm* — Carroll, Hoette & Butscher, LLC; Christopher R. Carroll

(57) ABSTRACT

An epitaxial structure of a light-emitting device and a manufacturing method thereof are provided. The epitaxial structure of the light-emitting device includes a first semiconductor layer, an active region and a second semiconductor layer sequentially stacked; where the active region includes at least one group of a barrier layer and a quantum well layer which are stacked, a surface of the quantum well layer away from the first semiconductor layer has a first roughness, a surface of the barrier layer away from the first semiconductor layer has a second roughness, and the first roughness is greater than the second roughness.

17 Claims, 4 Drawing Sheets

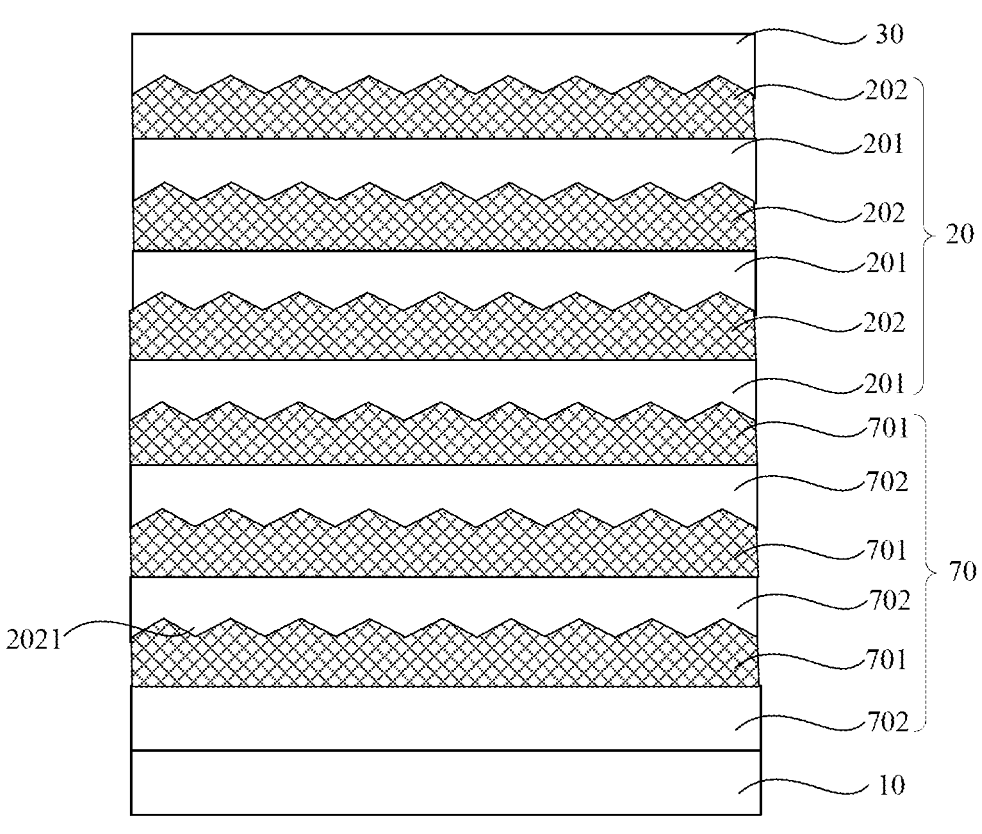

FIG. 5

Form a first semiconductor layer

100

Form an active region comprising at least one group of a barrier layer and a quantum well layer which are stacked, where forming the quantum well layer comprises sequentially occurring a first time period and a second time period, in the second time period, an etch source is introduced, such that a surface of the quantum well layer away from the first semiconductor layer has a first roughness, then, the barrier layer is formed, a surface of the barrier layer away from the first semiconductor layer has a second roughness, and the first roughness is greater than the second roughness

200

Form a second semiconductor layer

EPITAXIAL STRUCTURE OF LIGHT-EMITTING DEVICE AND MANUFACTURING METHOD THEREOF

CROSS REFERENCE TO RELATED APPLICATIONS

This application claims priority to Chinese Patent Application No. 202211014415.5 filed on Aug. 23, 2022, the entire content of which is incorporated herein by reference.

TECHNICAL FIELD

The present disclosure relates to the field of semiconductor technologies and in particular to an epitaxial structure of a light-emitting device and a manufacturing method thereof.

BACKGROUND

Along with the development of semiconductor technologies, a light-emitting diode (LED), as a semiconductor electronic element capable of emitting light is very popular due to its advantages of small volume, low energy consumption, long service life and low drive voltage and the like, and is widely applied in indicator lamps and display screens and so on.

Gallium nitride (GaN), as a wide bandgap semiconductor material, is now applied in manufacture of GaN-based LEDs and becomes a hot spot in research of the light-emitting semiconductor devices. An active region is a light-emitting layer of an LED and can be formed of InGaN or GaN. In the related art, with increase of the In component in the active region, the quality of the active region is severely lowered and thus an LED epitaxial structure with high In component cannot be achieved.

SUMMARY

In view of this, the present disclosure provides an epitaxial structure of a light-emitting device and a manufacturing method thereof, so as to address the problem of low light-emission efficiency.

According to a first aspect of embodiments of the present disclosure, there is provided an epitaxial structure of a light-emitting device, which includes a first semiconductor layer, an active region and a second semiconductor layer sequentially stacked; where the active region includes at least one group of a barrier layer and a quantum well layer which are stacked, a surface of the quantum well layer away from the first semiconductor layer has a first roughness, a surface of the barrier layer away from the first semiconductor layer has a second roughness, and the first roughness is greater than the second roughness.

In an embodiment, the surface of the quantum well layer away from the first semiconductor layer is provided with at least one first recess, and the surface of the barrier layer away from the first semiconductor layer is provided with at least one second recess; where an average depth of the first recess per unit area is greater than an average depth of the second recess per unit area, and a direction of the depth is perpendicular to a plane where the first semiconductor layer is located, such that the first roughness is greater than the second roughness.

In an embodiment, for each of the at least one first recess, the depth of the first recess is 0.5 nm to 5 nm; or, the first recess has a width of 0.5 nm to 5 nm in a direction parallel to the plane where the first semiconductor layer is located.

In an embodiment, the surface of the quantum well layer away from the first semiconductor layer is provided with at least one first recess, the at least one first recess includes a V-pit, and the quantum well layer where the V-pit is located is formed with a semi-polar or non-polar face.

In an embodiment, the surface of the barrier layer away from the first semiconductor layer is flat.

In an embodiment, a material of the barrier layer includes a Ⅲ-V compound semiconductor material, and a material of the quantum well layer includes a Ⅲ-V compound semiconductor material.

In an embodiment, the material of the quantum well layer is indium gallium nitride (InGaN) or indium aluminum gallium nitrogen (InAlGaN), where a ratio of the In component is greater than 5%.

In an embodiment, a thickness of the barrier layer in a direction perpendicular to a plane where the first semiconductor layer is located is 3 nm to 20 nm, and/or, a thickness of the quantum well layer in a direction perpendicular to a plane where the first semiconductor layer is located is 0.5 nm to 20 nm.

In an embodiment, the thickness of the barrier layer is greater than the thickness of the quantum well layer.

In an embodiment, the epitaxial structure further includes a third semiconductor layer between the first semiconductor layer and the active region, where the third semiconductor layer includes at least one group of a first sub-layer and a second sub-layer which are stacked, a surface of the first sub-layer away from the first semiconductor layer has a third roughness, a surface of the second sub-layer away from the first semiconductor layer has a fourth roughness, and the third roughness is greater than the fourth roughness.

In an embodiment, the first sub-layer has the same material as the quantum well layer in the active region, and the second sub-layer has the same material as the barrier layer in the active region.

According to a second aspect of embodiments of the present disclosure, there is provided a method of manufacturing an epitaxial structure of a light-emitting device, which is applied to manufacturing the above epitaxial structure of the light-emitting device. The method includes: forming a first semiconductor layer; forming an active region including at least one group of a barrier layer and a quantum well layer which are stacked, where forming the quantum well layer includes sequentially occurring a first time period and a second time period, in the second time period, an etch source is introduced, such that a surface of the quantum well layer away from the first semiconductor layer has a first roughness, then, the barrier layer is formed, a surface of the barrier layer away from the first semiconductor layer has a second roughness, and the first roughness is greater than the second roughness; and forming a second semiconductor layer.

In an embodiment, the etch source includes one or a combination of several of tert-butyl chloride, $Cl_2$, HCl, $PCl_3$, $BCl_3$, and $H_2$.

In an embodiment, the method further includes, before forming an active region: forming a third semiconductor layer on the first semiconductor layer, where the third semiconductor layer includes at least one group of a first sub-layer and a second sub-layer which are stacked, a surface of the first sub-layer away from the first semiconductor layer has a third roughness, a surface of the second sub-layer away from the first semiconductor layer has a fourth roughness, and the third roughness is greater than the fourth roughness.

In an embodiment, a temperature range for manufacturing the epitaxial structure is 540° C. to 1100° C., and a pressure range for manufacturing the epitaxial structure is 50 Torr to 700 Torr.

In an embodiment, when a material of the quantum well layers is InGaN, a range of a ratio of a Ga source to a In source is 0.1 to 1; when a N source is $NH_3$, a molar ratio of $NH_3$ to the Ga source and the In source is in a range of 300:1 to 30000:1, and a molar ratio of the etch source to the Ga source and the In source is in a range of 100:1 to 3000:1.

It should be understood that the above general descriptions and subsequent detailed descriptions are merely illustrative and explanatory rather than limiting of the present disclosure.

BRIEF DESCRIPTION OF DRAWINGS

The accompanying drawings, which are incorporated in and constitute a part of the present description, illustrate embodiments consistent with the present disclosure and serve to explain the principles of the present disclosure together with the description.

FIG. 5 is a schematic diagram illustrating an epitaxial structure of a light-emitting device according to still another embodiment of the present disclosure.

FIG. 6 is a flowchart illustrating a method of manufacturing an epitaxial structure of a light-emitting device according to another embodiment of the present disclosure.

DETAILED DESCRIPTION

Figure 1:
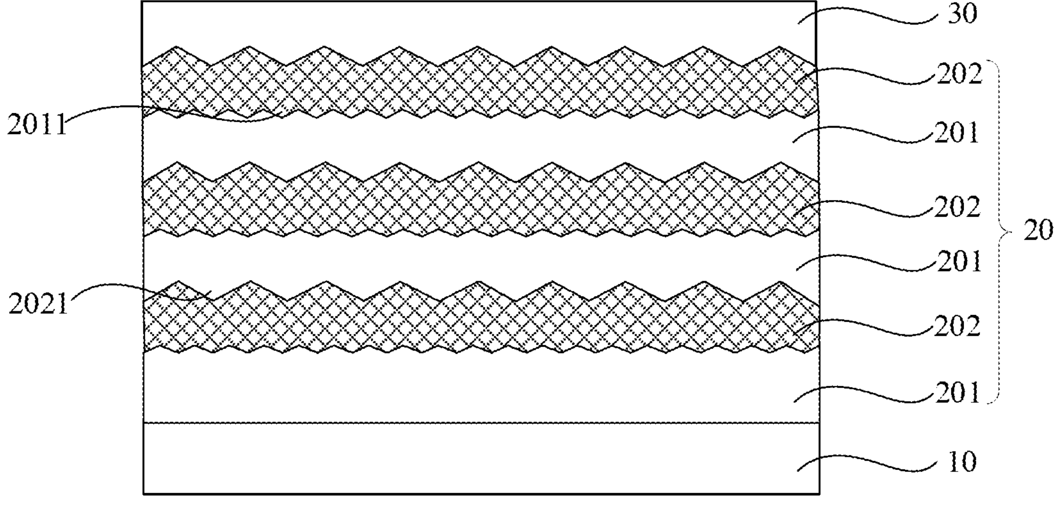
FIG. 1 is a schematic diagram illustrating an epitaxial structure of a light-emitting device according to an embodiment of the present disclosure.

Exemplary embodiments will be described in detail herein, with the illustrations thereof represented in the drawings. When the following descriptions involve the drawings, like numerals in different drawings refer to like or similar elements unless otherwise indicated. The embodiments described in the following examples do not represent all embodiments consistent with the present disclosure. Rather, they are merely examples of apparatuses and methods consistent with some aspects of the present disclosure as detailed in the appended claims.

The terms used in the present disclosure are for the purpose of describing particular embodiments only, and are not intended to limit the present disclosure. Terms determined by "a", "the" and "said" in their singular forms in the present disclosure and the appended claims are also intended to include plurality, unless clearly indicated otherwise in the context.

It should be understood that the terms "First" "second" and the like used in the specification and claims do not represent any sequence, quantity or importance, but distinguish different components. Similarly, the terms "one" or "a" and the like do not represent quantity limitation but represent at least one. Unless otherwise stated, the words such as "front", "rear", "lower" and/or "upper" are used only for ease of descriptions rather than limited to one position or a spatial orientation. The terms "include" or "contain" or the like is intended to refer to that an element or object appearing before "include" or "contain" covers an element or object or its equivalents listed after "include" or "contain" and does not preclude other elements or objects.

In combination with accompanying drawings, the epitaxial structure of the light-emitting device and the manufacturing method thereof provided by the embodiments of the present disclosure will be described in details below. In case of no conflicts, the following embodiments and the features in the implementations can be mutually supplemented or combined.

An embodiment of the present disclosure provides an epitaxial structure of a light-emitting device. FIG. 1 is a schematic diagram illustrating the epitaxial structure of the light-emitting device according to the embodiment of the present disclosure. As shown in FIG. 1, the epitaxial structure includes a first semiconductor layer 10, an active region 20 and a second semiconductor layer 30 sequentially stacked. The active region 10 includes at least one group of a barrier layer 201 and a quantum well layer 202 which are stacked. A surface of the quantum well layer 202 away from the first semiconductor layer 10 has a first roughness, and a surface of the barrier layer 201 away from the first semiconductor layer 10 has a second roughness, where the first roughness is greater than the second roughness.

Figure 2:
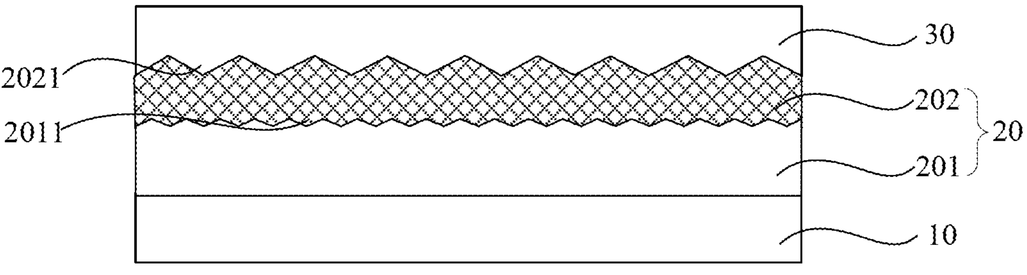
FIG. 2 is a schematic diagram illustrating an epitaxial structure of a light-emitting device according to another embodiment of the present disclosure.
Figure 3:
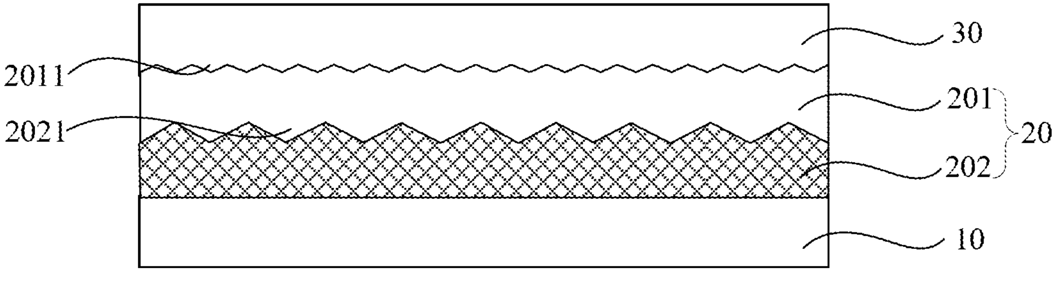
FIG. 3 is a schematic diagram illustrating an epitaxial structure of a light-emitting device according to yet another embodiment of the present disclosure.

The active region 20 is a multi-layer structure formed by two different semiconductor material layers (the barrier layer 201 and the quantum well layer 202) alternately growing. The barrier layer 201 is sufficiently thick, such that the coupling between carrier wave functions between neighbouring quantum well layers 202 is very small, and the multi-layer structure may be formed with many separated structure pairs of the barrier layer and the quantum well layer which constitute the action region 20 of the present disclosure. In an embodiment, FIG. 2 is a schematic diagram illustrating an epitaxial structure of a light-emitting device according to another embodiment of the present disclosure, and FIG. 3 is a schematic diagram illustrating an epitaxial structure of a light-emitting device according to yet another embodiment of the present disclosure. As shown in FIGS. 2 and 3, the active region 20 may also include one barrier layer 201 and one quantum well layer 202. In an embodiment, the positions of the barrier layer 201 and the quantum well layer 202 in the active region 20 can be exchanged, the present disclosure is not limited herein. In the embodiment, at least one group of active region 20 is formed by stacking a GaN barrier layer and an InGaN quantum well layer. In an embodiment, a material of the first semiconductor layer 10 may be an n-type semiconductor material, and a material of the second semiconductor layer 30 may be a p-type semiconductor material. When the first semiconductor layer generates electrons and the second semiconductor layer generates holes, the electrons and the holes spontaneously move toward the active region 20 and recombine to form photons. In an embodiment, the material of the first semiconductor layer 10 may be a p-type semiconductor material, and the material of the second semiconductor layer 30 may be an n-type semiconductor material. When the first semiconductor layer generates holes and the second semiconductor layer generates electrons, the electrons and the holes spontaneously move toward the active region 20 and recombine to form photons.

It is to be noted that, as shown in FIG. 1, in the present disclosure, the first roughness of the surface of the quantum well layer 202 away from the first semiconductor layer 10 is greater than the second roughness of the surface of the barrier layer 201 away from the first semiconductor layer 10. Thus, the first roughness of the surface of the quantum well layer 202 away from the first semiconductor layer 10 is higher. An etch source may be added when the quantum well layer 202 is manufactured epitaxially and then reacted with the quantum well layer 202 to increase the roughness. In this case, the actual surface area of the surface of the quantum well layer 202 away from the first semiconductor layer 10 is larger, such that the possibility that the electrons and the holes recombine to emit light in the active region 20 is increased, and it is favourable for the electrons and holes to complete recombination and form photons in the active region 20, so as to increase the light-emission efficiency of the light-emitting device. In an embodiment, the quantum well layer 202 is of InGaN material, and the etch source reacts with the component Ga in the quantum well layer 202 and leaves the In component, which relatively increases the In component of the quantum well layer 202. Therefore, a long-wavelength light-emitting device with high In component can be obtained. The second roughness of the surface of the barrier layer 201 away from the first semiconductor layer 10 is lower. In an embodiment, the barrier layer 201 is of GaN material, and the transverse epitaxy formation of the barrier layer 201 can be promoted with high epitaxial temperature and high N/Ga molar ratio, resulting in reduced roughness, lower defect density and better epitaxial crystal quality, and reducing the capture for the carriers and light absorption, and further helping the entire light-emission efficiency of the light-emitting device.

It is to be noted that, as shown in FIG. 1, in embodiments of the present disclosure, whether a surface of a side of the second semiconductor layer 30 close to the first semiconductor layer 10 has a roughness is not defined. In an embodiment, another structure may be included between the active region 20 and the second semiconductor layer 30. In an embodiment, as shown in FIG. 1, the surface of the quantum well layer 202 away from the first semiconductor layer 10 is provided with at least one first recess 2021, and the surface of the barrier layer 201 away from the first semiconductor layer 10 is provided with at least one second recess 2011. An average depth of the first recess 2021 per unit area is greater than an average depth of the second recess 2011 per unit area, and a direction where the depth is located is perpendicular to a plane where the first semiconductor layer 10 is located, such that the first roughness is greater than the second roughness.

It is to be noted that the first recess 2021 enables the surface of the quantum well layer 202 away from the first semiconductor layer 10 to present an uneven three-dimensional surface morphology, and the second recess 2011 enables the surface of the barrier layer 201 away from the first semiconductor layer 10 to present an uneven three-dimensional surface morphology. The fact that the first roughness is greater than the second roughness is reflected in that: the average depth of the first recess 2021 per unit area is greater than the average depth of the second recess 2011 per unit area. In an embodiment, when the number of the first recesses 2021 is approximate to the number of the second recesses 2011, the average depth of the first recess 2021 is greater than the average depth of the second recess 2011. The first roughness is greater than the second roughness, and the surface of the quantum well layer 202 away from the first semiconductor layer 10 has a larger area, such that the carriers have a larger recombination region, helping more to increase the light-emission performance of the light-emitting device. It is to be noted that the unit area refers to that the average depths of the first recess 2021 and the second recess 2011 are compared in a same area, for example, in 1 $mm^2$ or 2 $mm^2$, and those skilled in the art can set the specific value of the unit area based on actual situations, which is not limited in the present disclosure.

In an embodiment, the average depth of the first recess 2021 per unit area is approximate to the average depth of the second recess 2011 per unit area, and the number of the first recesses 2021 is greater than the number of the second recesses 2011, such that the first roughness is greater than the second roughness.

In an embodiment, as shown in FIG. 1, in unit area, the surface of the quantum well layer 202 away from the first semiconductor layer 10 includes a plurality of first recesses 2021, and the surface of the barrier layer 201 away from the first semiconductor layer 10 includes a plurality of second recesses 2011. When the plurality of first recesses 2021 have an average depth greater than that of the plurality of second recesses 2011, the first roughness is greater than the second roughness. In an embodiment, when the number of the plurality of first recesses 2021 is greater than the number of the plurality of second recesses 2011 (not shown), the first roughness is greater than the second roughness.

In an embodiment, for each of the first recesses 2021, the depth of the first recess 2021 may be 0.5 nm to 5 nm; or, a width of the first recess 2021 in a direction parallel to the plane where the first semiconductor layer 10 is located is 0.5 nm to 5 nm. The depth of the first recess 2021 may be, for example, 0.5 nm, 1.5 nm, 3.5 nm or 5 nm or the like, and the width of the first recess 2021 may be, for example, 0.5 nm, 1.5 nm, 3.5 nm or 5 nm or the like. In the present disclosure, the specific value of the depth or width of the first recess 2021 is not limited. In this case, it can be avoided that the size of the first recess 2021 is set to too small such that the actual area of the surface of the quantum well layer 202 away from the first semiconductor layer 10 is not increased much over a projection area of the quantum well layer 202 on the first semiconductor layer 10, leading to inability to effectively increase the light-emission performance of the light-emitting device. Furthermore, because the thickness of the quantum well layer 202 is small, the above disposal can also avoid affecting the light-emission performance of the light-emitting device due to the too large size of the first recesses 2021. In an embodiment, there may be a plurality of first recesses 2021, and the depths of all the first recesses 2021 may be unequal and between 0.5 nm to 5 nm; or, the widths of all the first recesses 2021 may be unequal and between 0.5 nm to 5 nm.

In an embodiment, as shown in FIGS. 1 to 3, the first recess 2021 is a V-shaped recess which is easy to manufacture and process. In some other embodiments, the first recess 2021 may have another shape, for example, rectangle and arc and the like. It is to be noted that the first recess or the second recess in all the drawings of the present disclosure are only illustrated as a V-shaped recess and not as a rectangular or arc recess. It is to be further noted that the first recess or the second recess in all the drawings of the present disclosure are uniformly distributed on the surface of the quantum well layer or the surface of the barrier layer, and the first recess or the second recess may also be distributed non-uniformly.

In an embodiment, the surface of the quantum well layer 202 away from the first semiconductor layer 10 is provided with at least one first recess 2021. For each of the at least one first recess 2021, the first recess 2021 include a V-pit, and the quantum well layers where the V-pit is located is formed with a semi-polar or non-polar face. It is to be noted that the V-pit refer to a V-shaped pit. In an embodiment, the semi-polar face is (10-11) crystal face, and the polarization electric field of the face is small. The quantum-confined Stark effect is very weak, the overlap degree of the electron-hole wave function is increased, and the radiative recombination probability is accordingly increased.

Figure 4:
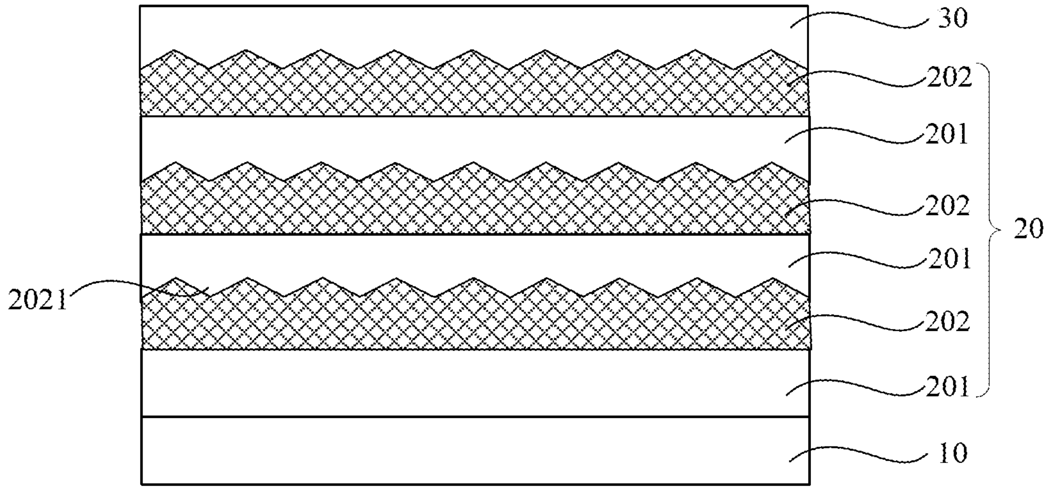
FIG. 4 is a schematic diagram illustrating a flat surface of a barrier layer away from a first semiconductor layer in an epitaxial structure of a light-emitting device according to an embodiment of the present disclosure.

In an embodiment, FIG. 4 is a schematic diagram illustrating a flat surface of the barrier layer away from the first semiconductor layer in the epitaxial structure of the light-emitting device according to an embodiment of the present disclosure. As shown in FIG. 4, the surface of the barrier layer 201 away from the first semiconductor layer 10 is flat, and namely, the second roughness of the surface of the barrier layer 201 away from the semiconductor layer 10 is extremely small and can be neglected in the solution of the present disclosure. With transverse epitaxial generation of the material of the barrier layer 201, the defect density of the formed barrier layer 201 is significantly reduced and the capture of the barrier layer 201 for the carriers can be reduced while the crystal quality of the barrier layer 201 is improved, helping increase the light-emission efficiency of the light-emitting device.

In an embodiment, the material of the barrier layer 201 is Ⅲ-V compound semiconductor material; the material of the quantum well layer 202 is Ⅲ-V compound semiconductor material. The Ⅲ-V compound semiconductor material may be a GaN-based material which has the advantages of large bandgap width, high breakthrough field strength, large electron mobility, and strong radiation resistance and the like. Alternatively, the material of the barrier layer 201 is GaN and the material of quantum well layer 202 is InGaN or InAlGaN.

In an embodiment, the material of the quantum well layer 202 is indium gallium nitride (InGaN) or indium aluminum gallium nitrogen (InAlGaN), where a ratio of the In component is greater than 5%. When the quantum well layer 202 uses the above material, it helps to adjust the bandgap width of the quantum well layer 202, increase the ratio of the In component in the quantum well layer 202 and raise the wavelength coverage scope of the quantum well layer 202. The quantum well layer 202 manufactured by using the InGaN material with high In component can be used as the quantum well layer of a long-wavelength LED light-emitting device. Alternatively, the epitaxial structure of the light-emitting device in the present disclosure can be used to manufacture red light LED, green light LED or blue light LED.

In an embodiment, the epitaxial structure of the light-emitting device in the present disclosure is used to manufacture an ultraviolet light-emitting device, where the barrier layer contains AlGaN with high A1 component and the quantum well layer contains AlGaN with low A1 component. The first roughness of the surface of the quantum well layer away from the first semiconductor layer is greater than the second roughness of the surface of the barrier layer away from the first semiconductor layer, and the actual surface area of the surface of the quantum well layer away from the first semiconductor layer is larger, which increases the possibility that the electrons and holes recombine to emit light in the active region 20, and helps more to enable the electrons and holes to complete recombination and form photons in the active region, so as to increase the light-emission efficiency of the light-emitting device. The roughness of the surface of the barrier layer away from the first semiconductor layer is lower, resulting in reduced defect density and better epitaxial crystal quality, and reducing the capture of the barrier layer for the carriers and light absorption, and further helping the entire light-emission efficiency of the light-emitting device.

In an embodiment, the barrier layer 201 has a thickness of 3 nm to 20 nm in a direction perpendicular to the plane where the first semiconductor layer 10 is located. The thickness of the barrier layer 201 may be, for example, 3 nm, 7 nm, 12 nm, 16 nm, 20 nm or the like.

In an embodiment, the quantum well layer 202 is a thickness of 0.5 nm to 20 nm in the direction perpendicular to the plane where the first semiconductor layer 10 is located. The thickness of the quantum well layer 202 may be, for example, 0.5 nm, 1 nm, 5 nm, 10 nm or 20 nm or the like.

In an embodiment, the thickness of the barrier layer 201 is greater than the thickness of the quantum well layer 202. For example, the thickness of the barrier layer 201 is 20 nm, and the thickness of the quantum well layer 202 is 10 nm. For example, the thickness of the barrier layer 201 is 10 nm and the thickness of the quantum well layer 202 is 1 nm.

In an embodiment, FIG. 5 is a schematic diagram illustrating an epitaxial structure of a light-emitting device according to still another embodiment of the present disclosure. As shown in FIG. 5, the epitaxial structure of the light-emitting device further includes a third semiconductor layer 70 between the first semiconductor layer 10 and the active region 20. The third semiconductor layer 70 includes at least one group of a first sub-layer 701 and a second sub-layer 702 which are stacked. A surface of the first sub-layer 701 away from the first semiconductor layer 10 has a third roughness, and a surface of the second sub-layer 702 away from the first semiconductor layer 10 has a fourth roughness, where the third roughness is greater than the fourth roughness. The active region 20 is used for the electrons and the holes to recombine to emit light, and the third semiconductor layer 70 is used to release stress and improve the crystal quality of the active region 20 of epitaxial growth.

In an embodiment, the first sub-layer 701 has the same material as the quantum well layer 202 in the active region 20, and the second sub-layer 702 has the same material as the barrier layer 201 in the active region 20. The method of manufacturing the third semiconductor layer 70 epitaxially is the same as the method of manufacturing the active region 20. For example, a etch source is added at the time of manufacturing the first sub-layer 701 epitaxially to react with the first sub-layer 701, so as to increase the roughness, and hence the third roughness is approximate to the first roughness and the fourth roughness is approximate to the second roughness.

Based on the same invention idea, an embodiment of the present disclosure provides a method of manufacturing a display panel, which is used to manufacture the above epitaxial structure of the light-emitting device. FIG. 6 is a flowchart illustrating a method of manufacturing an epitaxial structure of a light-emitting device according to an embodiment of the present disclosure. As shown in FIG. 6, the manufacturing method of the present disclosure includes the following steps 100 to 300.

At step 100, a first semiconductor layer 10 is formed.

At step 200, an active region 20 is formed, where the active region 20 includes at least one group of a barrier layer 201 and a quantum well layer 202 which are stacked. When the quantum well layer 202 is formed, a first time period t1 and a second time period t2 sequentially occurring are included, where in the second time period t2, an etch source is introduced, such that a surface of the quantum well layer 202 away from the first semiconductor layer 10 has a first roughness; then, the barrier layer 201 is formed and a surface of the barrier layer 201 away from the first semiconductor layer 10 has a second roughness, where the first roughness is greater than the second roughness.

At step 300, a second semiconductor layer 30 is formed.

In the first time period t1, a part of the quantum well layer 202 is formed and then in the second time period t2, the etch source is added to further increase the first roughness of the surface of the quantum well layer 202 away from the first semiconductor layer 10. In this case, the actual area of the surface of the quantum well layer 202 away from the first semiconductor layer 10 is larger, which increases the possibility that the electrons and holes recombine to emit light in the active region 20, and helps more to enable the electrons and holes to complete recombination and form photons in the active region 20, so as to increase the light-emission efficiency of the light-emitting device.

Figure 7:
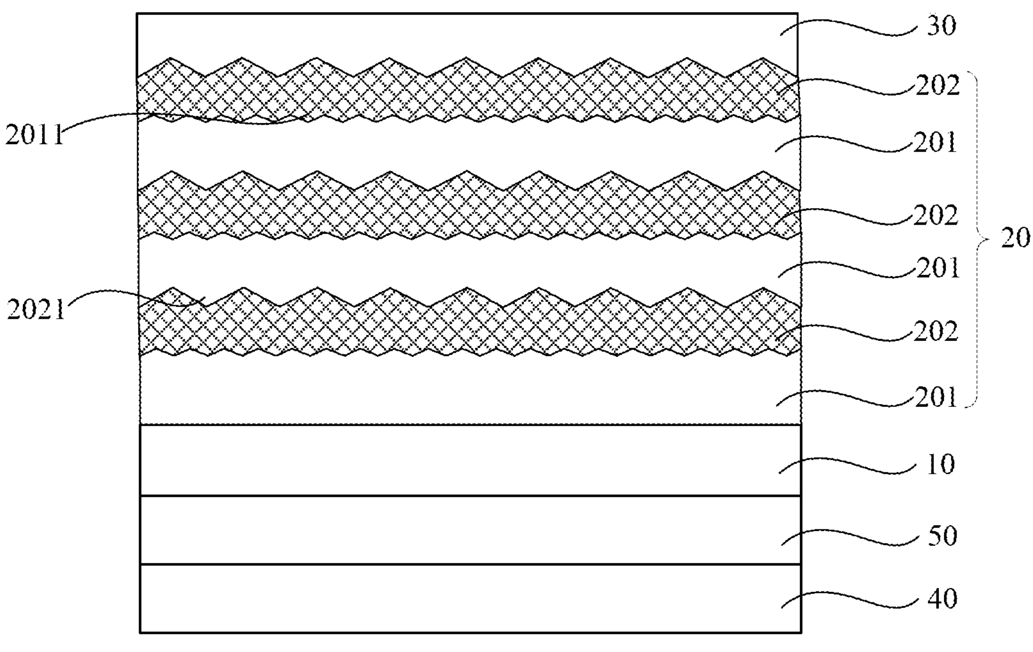
FIG. 7 is a schematic diagram illustrating an epitaxial structure of a light-emitting device according to still another embodiment of the present disclosure.

FIG. 7 is a schematic diagram illustrating an epitaxial structure of a light-emitting device according to an embodiment of the present disclosure. Before the step 100, as shown in FIG. 7, the method includes forming a substrate 40 and forming a u-type GaN layer 50 on the substrate 40.

In the step 100, a material of the first semiconductor layer 10 may be an n-type semiconductor material, and specifically may be an n-type GaN material.

In the step 200, as shown in FIG. 7, the active region 20 includes three groups of barrier layers 201 and quantum well layers 202. In some other embodiments, the active region 20 may also include another number of groups of stacked barrier layers 201 and quantum well layers 202, which is not limited in the present disclosure. The material of the barrier layers 201 is Ⅲ-V compound semiconductor material, which may specifically be GaN material. The material of the quantum well layers 202 is Ⅲ-V compound semiconductor material, which may specifically be InGaN or InAlGaN material.

When the material of the quantum well layers 202 formed in this step is InGaN or InAlGaN material, a ratio of the In component in the quantum well layers 202 is greater than 5% and the increased ratio of the In component in the quantum well layers 202 can increase a wavelength coverage scope of the quantum well layers 202 to enable the LED light-emitting device to emit long-wavelength light such as red light. However, when the material of the barrier layers 201 is GaN material and the material of the quantum well layers 202 is InGaN or InAlGaN material, since there is a large lattice mismatch between the GaN material and the InGaN or InAlGaN material (especially when the In component has a high ratio), it is easy to result in quantum-confined Stark effect which reduces the possibility of recombination of the carriers. Therefore, the quality of the quantum well layers 202 (InGaN or InAlGaN material) formed epitaxially on the barrier layers 201 (GaN material) is poor, affecting the light-emission performance of the LED light-emitting device.

In order to increase the ratio of the In component in the quantum well layers 202, the etch source is introduced in this step. When the quantum well layers 202 are formed epitaxially, the material of the quantum well layers 202 is etched. Since the introduced etch source does not react with the In element, the In element is left and hence the ratio of the In component in the quantum well layers 202 is increased. In this embodiment, the etch source may include one or a combination of several of the following materials: tert-butyl chloride, $Cl_2$, HCl, $PCl_3$, $BCl_3$, and $H_2$. For example, the etch source is HCl, and the material of the quantum well layers 202 is InGaN. When the quantum well layers 202 are formed epitaxially, the quantum well layers 202 react with the etch source to form gallium chloride gas overflowing, leaving the In element. Thus, the ratio of the In component in the quantum well layers 202 is increased. For example, the etch source is $H_2$, and the material of the quantum well layers 202 is InGaN. When the quantum well layers 202 are formed epitaxially, $H_2$ is ionized under high temperature to form hydrogen in ionic state, which combines with nitrogen in the quantum well layers 202 to etch the quantum well layers 202 and form the quantum well layers 202 with larger surface roughness. For example, the etch source is a combined gas of HCl and $Cl_2$.

Specifically, the manufacture of the epitaxial structure may be carried out by performing chemical vapor deposition on a metal-organic compound. In the present disclosure, a temperature range of the manufacture process is 540° C. to 1100° C., and a pressure range of the manufacture chamber is 50 Torr to 700 Torr. In the manufacture process, the Ga source introduced into the manufacture chamber may be TMGa or TEGa, the In source may be TMIn or TEIn, and the N source may be, for example, $NH_3$. The carrier gas of the Ga source, In source or N source may be $N_2$ or $H_2$ or another inert gas. A range of a ratio of the Ga source to the In source is 0.1 to 1. When the N source is $NH_3$, the molar ratio of $NH_3$ to Ga source and In source is in a range of 300:1 to 30000:1, and the molar ratio of the etch source to the Ga source and the In source is in a range of 100:1 to 3000:1. The above descriptions are not intended to limit the present disclosure and those skilled in the art can properly adjust the reaction gases and various process parameters based on actual situations.

In the step 200, by using the etch source, a first recess 2021 may be formed on the surface of the quantum well layer 202 away from the first semiconductor layer 10, where the depth of the first recess 2021 may be 0.5 nm to 5 nm and the width of the first recess 2021 along a direction parallel to a plane where the first semiconductor layer 10 is located may be 0.5 nm to 5 nm.

In the step 200, after the quantum well layer 202 is manufactured, a barrier layer 201 is manufactured on a surface of the quantum well layer 202 away from the first semiconductor layer 10. A surface of the barrier layer 201 away from the first semiconductor layer 10 is flat and hence the barrier layer with a flat surface can promote transverse epitaxial formation of the GaN material with higher epitaxial temperature and H/Ga ratio (i.e. V-group element/III-group element), and thus, a barrier layer 201 with low defect density and good crystal quality can be obtained to reduce its capture for the carriers and light absorption, helping the entire light-emission efficiency of the LED structure.

In the step 300, the material of the second semiconductor layer 30 may be a p-type semiconductor material and specifically may be a p-type GaN material.

Figure 8:
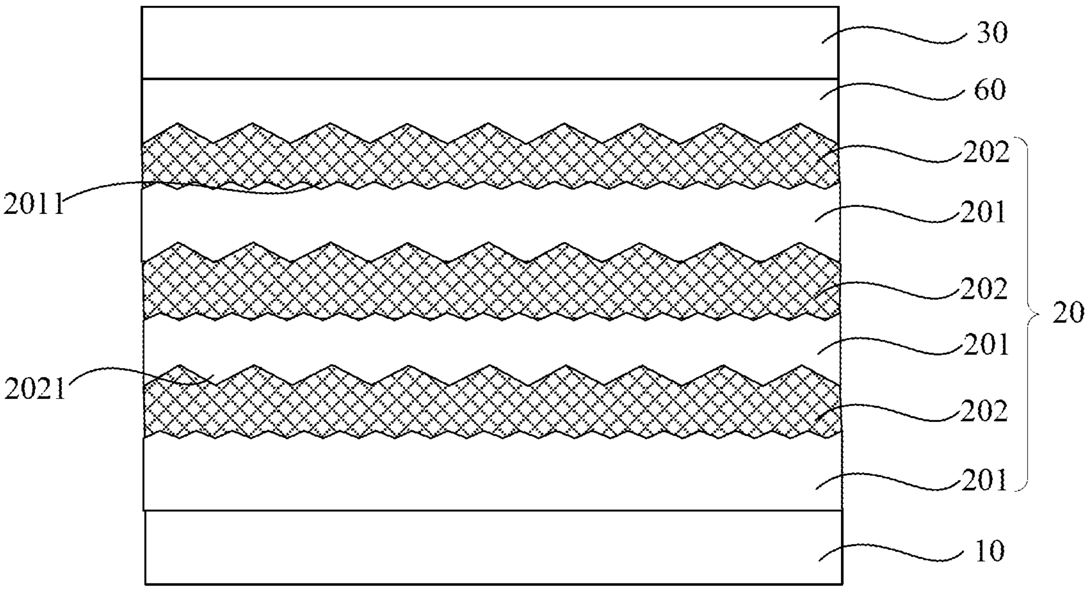
FIG. 8 is a schematic diagram illustrating an epitaxial structure of a light-emitting device according to still another embodiment of the present disclosure.

FIG. 8 is a schematic diagram illustrating an epitaxial structure of a light-emitting device according to an embodiment of the present disclosure. Before the step 300, as shown in FIG. 8, the method further includes forming a blocking layer 60 between the active region 20 and the second semiconductor layer 30. A material of the blocking layer 60 may be GaN material. When the material of the second semiconductor layer 30 is a p-type GaN material, the blocking layer 60 can block seepage of the magnesium ions in the p-type GaN material toward the active region 20.

The epitaxial structure of the light-emitting device provided by the present disclosure includes a first semiconductor layer, an active region and a second semiconductor layer sequentially stacked; the active region includes at least one group of stacked barrier layer and quantum well layer, a surface of the quantum well layer away from the first semiconductor layer has a first roughness, a surface of the barrier layer away from the first semiconductor layer has a second roughness, and the first roughness is greater than the second roughness. The actual surface area of the surface of the quantum well layer away from the first semiconductor layer is larger, which increases the possibility that the electrons and holes recombine to emit light in the active region 20, and helps more to enable the electrons and holes to complete recombination and form photons in the active region, so as to increase the light-emission efficiency. The roughness of the surface of the barrier layer away from the first semiconductor layer is lower, reducing the capture of the barrier layer for the carriers and light absorption, and further helping improve the light-emission efficiency of the light-emitting device.

In an embodiment, the method further includes, before the step 200 (before forming an active region): forming a third semiconductor layer 70 on the first semiconductor layer 10, where the third semiconductor layer 70 includes at least one group of a first sub-layer 701 and a second sub-layer 702 which are stacked, a surface of the first sub-layer 701 away from the first semiconductor layer 10 has a third roughness, a surface of the second sub-layer 702 away from the first semiconductor layer 10 has a fourth roughness, and the third roughness is greater than the fourth roughness.

The above descriptions are made only to the preferred embodiments of the present disclosure and not intended to limit the present disclose in any form. Although the present disclosure is already described with the preferred embodiments as above, the preferred embodiments are not meant to limit the present disclosure. Those skilled in the art can, without departing from the scope of the technical solutions of the present disclosure, make some changes to the above-disclosed technical contents or modify them as equivalent embodiments of equivalent changes. But, any simple changes, equivalent changes and modifications made to the above embodiments based on the technical essence of the present disclosure without departing from the contents of the technical solutions of the present disclosure shall fall within the scope of the technical solutions of the present disclosure.

The contents disclosed by the patent document contain copyright-protected materials, the copyright of which remains with the copyright owner. The copyright owner does not disallow any person to copy the official records in the patent and trademark office and the patent document or the patent disclosure in the archives.

What is claimed is:

1. An epitaxial structure of a light-emitting device, comprising a first semiconductor layer, an active region and a second semiconductor layer sequentially stacked;

wherein the active region comprises at least two groups of barrier layers and quantum well layers which are stacked, a surface of each of the quantum well layers away from the first semiconductor layer has a first roughness, a surface of each of the barrier layers away from the first semiconductor layer has a second roughness, and the first roughness is greater than the second roughness;

wherein the surface of each of the quantum well layers away from the first semiconductor layer is provided with at least one first recess, and the surface of each of the barrier layers away from the first semiconductor layer is provided with at least one second recess;

wherein surfaces of all of the quantum well layers have the same first roughness;

wherein surfaces of all of the barrier layers have the same second roughness.

2. The epitaxial structure of claim 1, wherein an average depth of the first recesses per unit area is greater than an average depth of the second recesses per unit area, the depths being measured in a direction perpendicular to a plane where the first semiconductor layer is located, such that the first roughness is greater than the second roughness.

3. The epitaxial structure of claim 2, wherein, for each of the first recesses, the depth of the first recess is 0.5 nm to 5 nm; or, the first recess has a width of 0.5 nm to 5 nm in a direction parallel to the plane where the first semiconductor layer is located.

4. The epitaxial structure of claim 1, wherein the surface of the quantum well layer away from the first semiconductor layer is provided with at least one first recess, at least one of the first recesses comprises a V-pit, and the quantum well layer where the V-pit is located is formed with a semi-polar or non-polar face.

5. The epitaxial structure of claim 1, wherein the surface of the barrier layer away from the first semiconductor layer is flat.

6. The epitaxial structure of claim 1, wherein a material of the barrier layer comprises a III-V compound semiconductor material, and a material of the quantum well layer comprises a III-V compound semiconductor material.

7. The epitaxial structure of claim 6, wherein the material of the quantum well layer is InGaN or InAlGaN, wherein a ratio of an In component is greater than 5%.

8. The epitaxial structure of claim 1, wherein a thickness of the barrier layer in a direction perpendicular to a plane where the first semiconductor layer is located is 3 nm to 20 nm, and/or, a thickness of the quantum well layer in a direction perpendicular to a plane where the first semiconductor layer is located is 0.5 nm to 20 nm.

9. The epitaxial structure of claim 8, wherein the thickness of the barrier layer is greater than the thickness of the quantum well layer.

10. The epitaxial structure of claim 1, further comprising a third semiconductor layer between the first semiconductor layer and the active region, wherein the third semiconductor layer comprises at least one group of a first sub-layer and a second sub-layer which are stacked, a surface of the first sub-layer away from the first semiconductor layer has a third roughness, a surface of the second sub-layer away from the first semiconductor layer has a fourth roughness, and the third roughness is greater than the fourth roughness.

11. The epitaxial structure of claim 10, wherein the first sub-layer has the same material as the quantum well layer in the active region, and the second sub-layer has the same material as the barrier layer in the active region.

12. The epitaxial structure of claim 1, wherein a depth of each of the first recesses is less than a thickness of a corresponding one of the quantum well layers, and a depth of each of the second recesses is less than a thickness of a corresponding one of the barrier layers.

13. A method of manufacturing an epitaxial structure of a light-emitting device, comprising:

forming a first semiconductor layer;

forming an active region comprising at least two groups of barrier layers and quantum well layers which are stacked, wherein forming the quantum well layer comprises sequentially occurring a first time period and a second time period, in the second time period, an etch source is introduced, such that a surface of each of the quantum well layers away from the first semiconductor layer has a first roughness, then, the barrier layer is formed, a surface of each of the barrier layers away from the first semiconductor layer has a second roughness, and the first roughness is greater than the second roughness; and forming a second semiconductor layer;

wherein the surface of each of the quantum well layers away from the first semiconductor layer is provided with at least one first recess, and the surface of each of the barrier layers away from the first semiconductor layer is provided with at least one second recess;

wherein surfaces of all of the quantum well layers have the same first roughness;

wherein surfaces of all of the barrier layers have the same second roughness.

14. The method of claim 13, wherein the etch source comprises one or a combination of several of tert-butyl chloride, Cl2, HCl, PCl3, BCl3, and H2.

15. The method of claim 13, further comprising, before forming an active region:

forming a third semiconductor layer on the first semiconductor layer, wherein the third semiconductor layer comprises at least one group of a first sub-layer and a second sub-layer which are stacked, a surface of the first sub-layer away from the first semiconductor layer has a third roughness, a surface of the second sub-layer away from the first semiconductor layer has a fourth roughness, and the third roughness is greater than the fourth roughness.

16. The method of claim 13, wherein a temperature range for manufacturing the epitaxial structure is 540° C. to 1100° C., and a pressure range for manufacturing the epitaxial structure is 50 Torr to 700 Torr.

17. The method of claim 13, wherein when a material of the quantum well layers is InGaN, a range of a ratio of a Ga source to a In source is 0.1 to 1;

when a N source is NH3, a molar ratio of NH3 to the Ga source and the In source is in a range of 300:1 to 30000:1, and a molar ratio of the etch source to the Ga source and the In source is in a range of 100:1 to 3000:1.

* * * * *